United States Patent [19]

Lee

[11] Patent Number: 5,742,096
[45] Date of Patent: Apr. 21, 1998

[54] LEAD ON CHIP PACKAGE

[76] Inventor: Hee Gook Lee, Gaepo-2nd Woosung Apt. 11-605, Daechi-dong, Kangnam-ku, Seoul, Rep. of Korea

[21] Appl. No.: 943,908

[22] Filed: Sep. 11, 1992

[30] Foreign Application Priority Data

Sep. 11, 1991 [KR] Rep. of Korea .................. 15863/1991

[51] Int. Cl.$^6$ ...................................................... H01L 21/56
[52] U.S. Cl. ........................... 257/666; 257/672; 257/739; 257/783
[58] Field of Search ...................................... 257/666, 669, 257/674, 671, 753, 739, 735

[56] References Cited

U.S. PATENT DOCUMENTS

| | | | |
|---|---|---|---|
| 4,003,073 | 1/1977 | Helda et al. | 257/672 |
| 4,151,543 | 4/1979 | Hayakawa et al. | 257/739 |
| 5,086,018 | 2/1992 | Conry et al. | 257/783 |

*Primary Examiner*—William L. Sikes

[57] ABSTRACT

A lead on chip package comprising a semiconductor chip having a plurality of bonding pads and a plurality of minute protrusions formed at both side portions of the upper surface thereof, an insulating film made of a fluoroethylene film having knurled surfaces, and a plurality of inner leads each directly connected to each corresponding bonding pad of the semiconductor chip and provided with knurled surfaces. The formation of minute protrusions is accomplished by using a radio frequency (RF)-sputtering process at a low temperature. The formation of the knurled surfaces at the inner leads can be accomplished by passing the inner leads between rollers each having a knurled outer surface or by coating a nodule or dendrite layer over the surfaces of inner leads by an electro-plating using a high current density. Using the fluoroethylene film, the insulating film can reduce in thickness. By virtue of the knurled surfaces formed at the inner leads and the insulating film, the adhesion can be improved. It is also possible to prevent an occurrence of parasitic capacitance. As a result, there is provided an effect of assisting packages to be laminate.

3 Claims, 5 Drawing Sheets

F I G. 6b
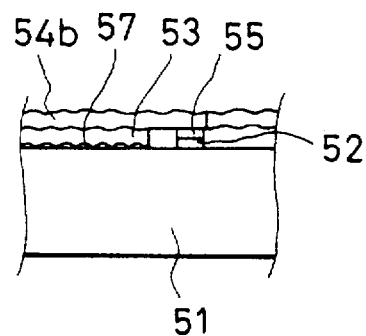
F I G. 6c
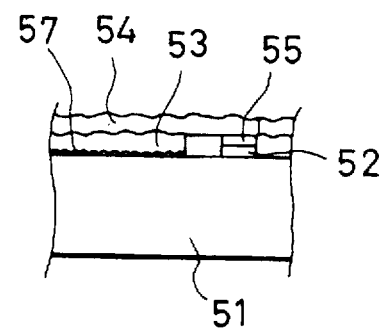
F I G. 7
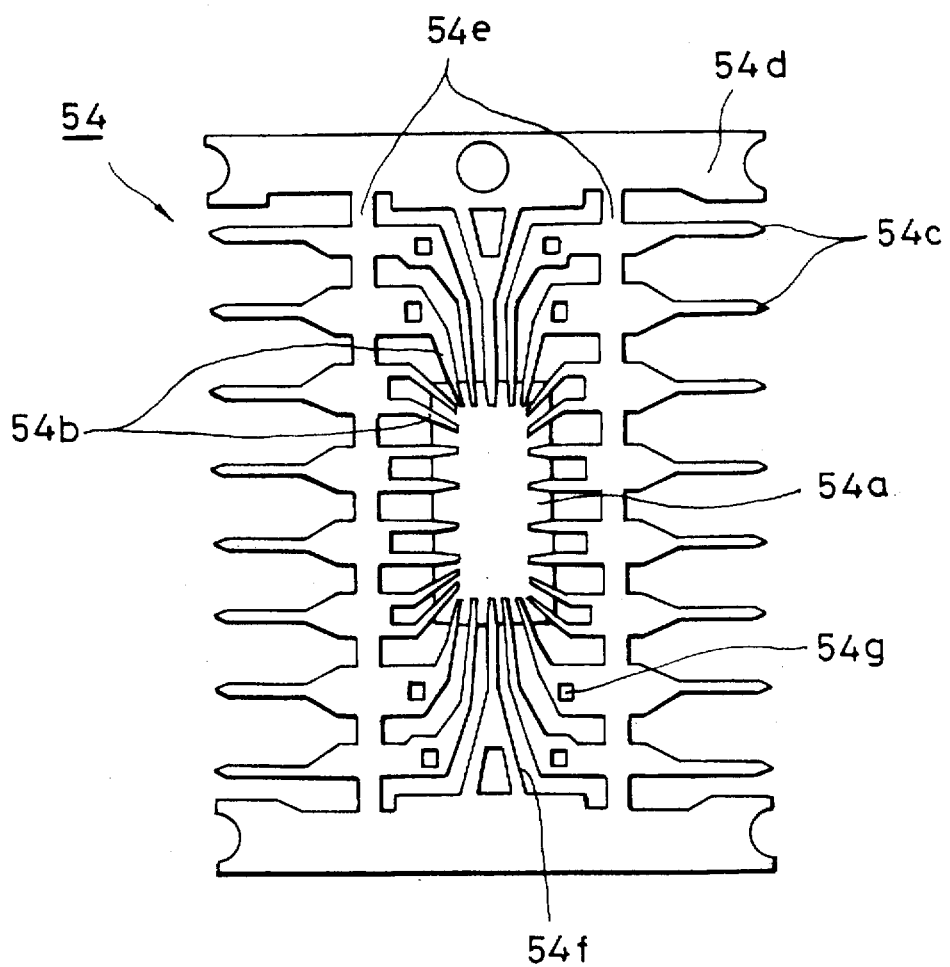

5,742,096

LEAD ON CHIP PACKAGE

BACKGROUND OF THE INVENTION

1. Field of the Invention

The present invention relates to a memory integrated circuit package and a method of making the same, and more particularly to a lead-on chip type package to be used for packaging a memory integrated circuit of 16-mega grade or greater and a method of making the same.

2. Description of the Prior Art

FIG. 1 is a sectional view of a package construction of a general memory integrated circuit (IC). On the other hand, FIG. 2 is a plan view of a lead frame of the memory IC shown in FIG. 1. For making such a package construction, a lead frame is first prepared which is adapted to package a chip obtained by dicing a wafer. The lead frame is denoted by the reference numeral 13 in FIGS. 1 and 2. As shown in FIG. 2, the lead frame 13 comprises a paddle 13a to which a semiconductor chip 11 prepared by dicing a wafer is attached, a plurality of inner leads 13b electrically connected to the chip 11 inwardly of the package, a plurality of outer leads 13c electrically connected to other elements outwardly of the package, a pair of spaced side rails 13d adapted to maintain the shape of the lead frame 13, dam bars 13e adapted to support the inner and outer leads 13b and 13c such that they are uniformly spaced between the side rails 13d, a pair of support bars 13f adapted to support the paddle 13a between the side rails 13d, and a plurality of locking holes 13g.

Attaching the chip 11 to the paddle 13a of lead frame 13 is achieved by a die bonding that is carried out after the preparation of the lead frame 13 having the above-mentioned construction. Subsequently, a wire bonding is carried out for electrically connecting bonding pads 12 of the chip 11 to corresponding inner leads 13b by means of wires 14. The bonding pads 12 are formed on the surface of chip 11, so as to achieve the wire bonding as mentioned above. They are formed in a double line in case of a dual in line type package and in a single line in case of a single in line type package. The illustrated case corresponds to the dual in line type package.

The lead frame 13 which has been subjected to the die bonding and wire bonding is then positioned in a mold 15 having a mold cavity corresponding a desired shape of a package to be produced. Thereafter, an epoxy molding compound (EMC) 16 is charged into the mold cavity of the mold 15 and a molding is then carried out to mold the semiconductor chip 11 and the inner leads 13b.

After molding, a trimming is carried out to remove dam bars 13e from the molded package. Subsequently, a forming process for shaping the outer leads 13c into a desired shape is performed. Thus, a memory IC package having the construction shown in FIG. 1 is obtained.

However, recent technical developments in manufacture of semiconductor elements lead memory ICs to be on an increasing trend in capacity. This trend also causes bare chips contained in semiconductor packages to increase in size. As a result, the occupied area of bare chip in the overall area of semiconductor package is on an increasing trend, resulting in an increase in the overall thickness of package.

Such an increase in the area occupied by the bear chip in the overall memory IC package area prevents the provision of a space assuring an accurate arrangement of the lead frame in the package. For solving this problem, there has been known a lead on chip (LOC) packaging technique wherein a packaging is achieved under the condition that a lead frame is laid on a chip.

Such a LOC packaging technique was used by IBM Corporation in U.S.A. in making 1-mega dynamic random access memories (1M DRAMs) and then by Hitachi, Ltd. in Japan in making 4M DRAMS. The LOC packaging technique will be a new packaging technique used in making 16M DRAM.

FIG. 3 is a sectional view of a construction of a conventional LOC package. As shown in FIG. 3, this LOC package comprises a semiconductor chip 31 attached to a paddle 34a of a lead frame and provided with a plurality of bonding pads 32 arranged in a line at the center portion of the upper surface of the semiconductor chip 31, an insulating film 33 formed over the upper surface of semiconductor chip 31 except for the surface portion corresponding to the bonding pads 32, that is, over both side portions of the upper surface of semiconductor chip 31, a plurality of inner leads 34b each extending such that its one end is positioned over the upper surface of semiconductor chip 31 attached to the paddle 34a of lead frame, each inner lead being electrically connected to each corresponding bonding pad 32 by means of a wire 35, a plurality of outer leads 34c each extending from the other end of each corresponding inner lead 34b and having a J shape, each outer lead being electrically connected to other external element, and a package body 36 surrounding the semiconductor chip 31, the insulating film 33 and the inner leads 34b.

Referring to FIG. 4, there is illustrated a construction of a lead frame for the conventional LOC package shown in FIG. 3. In similar to the construction of FIG. 2, the lead frame shown in FIG. 4 comprises a paddle 34a, a plurality of inner leads 34b, a plurality of outer leads 34c, a pair of side rails 34d, dam bars 34e, support bars 34f and locking holes 34g. In this case, however, each inner lead 34b has a sufficiently long length so that its one end can be positioned over the upper surface of the semiconductor chip 31 which is to be attached to the paddle 34a.

Now, a method of making such a LOC package having the above-mentioned construction will be described.

First, a lead frame 34 having the construction of FIG. 4 is prepared. Thereafter, the semiconductor chip 31 which was previously prepared by dicing a wafer is attached to the paddle 34a of the lead frame 34 using a die bonding. As the insulating film 33, a polyimide layer having a predetermined thickness is then coated over both side portions of the upper surface of semiconductor chip 31. A wire bonding is then carried out for electrically connecting the inner leads 34b to corresponding bonding pads of the chip 15, by means of wires 35.

Following the wire bonding, a molding is carried out for molding a predetermined part including the semiconductor chip 31, the insulating film 33 and the inner leads 34b, with an epoxy molding compound. That is, the lead frame 34 carrying the chip 31 is positioned in a mold (not shown). At this time, the outer leads 34c of lead frame 34 are positioned outwardly of the mold. The epoxy molding compound is charged into a mold cavity of the mold and the predetermined part is molded to form the package body 36.

A trimming is then performed for removing dam bars 34d and support bars 34f. Thereafter, a forming process for bending the outer leads 34c into a J-shape is carried out. Thus, a single in line type LOC package is obtained.

Such a LOC package has an advantage of increasing the area occupied by inner leads 34b in the package, in that the inner leads 34b of the lead frame 34 extend to an active cell of the semiconductor chip 31 and are electrically connected to the semiconductor chip 31 by means of the wires 35.

However, this type of LOC package-require s the use of a polymer as a non-conductive material for insulating the semiconductor chip 31 from the inner leads 34b of lead frame 34. The polymer is provided between the semiconductor chip 31 and the inner leads 34b of lead frame 34. The use of polymer results in a problem of decreasing bonding forces between the polymer and the lead frame 34 and between the lead frame 34 and the package body 36 made of the epoxy molding compound. Moreover, there is another problem that undesirable parasitic capacitance may occur between each inner lead 34b of lead frame 34 and a circuit of the semiconductor chip 31 disposed beneath the inner lead 34b.

Such a parasitic capacitance caused by the wire bonding between the semiconductor chip 31 and each inner lead 34b of lead frame 34 extending to the upper surface of semiconductor chip 31 can be avoided by forming the polymer layer thick so that the semiconductor chip 31 is perfectly insulated from each inner lead 34b. However, the increased thickness of polymer layer causes the overall memory IC package to increase in thickness. As a result, it is impossible to produce laminated packages.

SUMMARY OF THE INVENTION

Therefore, an object of the invention is to solve the above-mentioned problems encountered in the prior arts, to provide a LOC package capable of not only preventing an increase in parasitic capacitance and yet reducing the thickness of an insulating film, but also increasing the bonding forces between the insulating film and a lead frame and between the insulating film and a package body made of an epoxy molding compound and to provide a method of making the LOC package.

In one aspect, the present invention provides a lead on chip package comprising: a semiconductor chip having a plurality of bonding pads arranged in a line at the center portion of the upper surface of the semiconductor chip and a plurality of minute protrusions formed at both side portions of the upper surface; an insulating film formed over both side portions of the upper surface of the semiconductor chip and provided at its upper and lower surfaces with knurled surfaces; a plurality of inner leads each directly connected to each corresponding bonding pad of the semiconductor chip so as to be electrically connected to the semiconductor chip, each of the inner leads having knurled surfaces at its upper and lower surfaces; a package body surrounding the semiconductor chip, the insulating film and the inner leads; and a plurality of outer leads each extending from each corresponding inner lead and connected to an external element outwardly of the package body.

In another aspect, the present invention provides a method of making a lead on chip package comprising the steps of: preparing a lead frame including a paddle, a plurality of inner leads and a plurality of outer leads each extending from each corresponding inner lead; die bonding a semiconductor chip to the paddle of the lead frame, the semiconductor chip having a plurality of bonding pads arranged in a line at the center portion of the upper surface of the semiconductor chip; forming a plurality of minute protrusions at both side portions of the upper surface of the semiconductor chip except for its portions corresponding to the bonding pads; forming an insulating film over the protrusion-carrying upper surface of the semiconductor chip, the insulating film having knurled surfaces at its upper and lower surfaces; forming knurled surfaces at each of the inner leads, one of the knurled surfaces of each inner lead being in contact with one of the knurled surfaces of the insulating film; forming a solder over each pad of the semiconductor chip; soldering each inner lead to each corresponding solder so as to connect electrically the inner leads to the semiconductor chip; molding a predetermined part including the semiconductor chip, the insulating film and the inner leads so as to form a package body; and trimming and shaping the package body.

BRIEF DESCRIPTION OF THE DRAWINGS

The above and other objects, features and other advantages of the present invention will be more clearly understood from the following detailed description taken in conjunction with the accompanying drawings, in which:

FIGS. 6A to 6C are partially enlarged views of a package portion corresponding to a portion "A" of FIG. 5, illustrating different examples for an electrical connection between the semiconductor chip and the inner leads, respectively;

FIG. 7 is a plan view of a lead frame for the LOC package according to the first embodiment of the present invention;

DETAILED DESCRIPTION OF THE PREFERRED EMBODIMENTS

Figure 5:
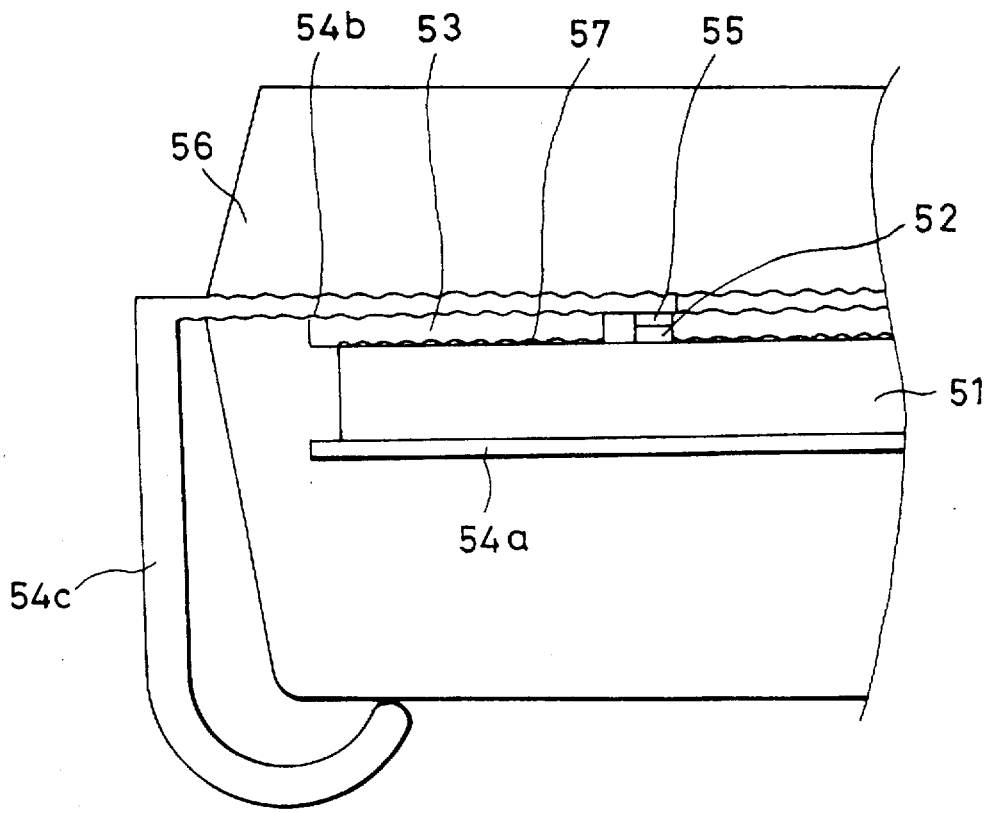
FIG. 5 is a sectional view of a LOC package according to a first embodiment of the present invention.

Referring to FIG. 5, there is illustrated a LOC package according to a first embodiment of the present invention.

As shown in FIG. 5, the LOC package comprises a semiconductor chip 51 having a plurality of bonding pads 52 arranged in a line at the center portion of the upper surface of the semiconductor chip 51. An insulating film 53 is formed over the upper surface of semiconductor chip 51 except for the surface portion corresponding to the bonding pads 52, that is, over both side portions of the upper surface of semiconductor chip 51. The LOC package also comprises a lead frame 54 including a paddle 54a, a plurality of inner leads 54b and a plurality of outer leads 54c. Each bonding pad 52 of semiconductor chip 51 is provided at its upper surface with a solder 55. Each inner lead 54b of lead frame 54 extends to the upper surface of semiconductor chip 51 such that its one end is positioned over the upper surface of semiconductor chip 51 and electrically connected to the semiconductor chip 51 by means of the solder 55 provided at each corresponding bonding pad 52. A package body 56 which is molded using an epoxy molding compound is provided to surround the semiconductor chip 51, the inner leads 54b of lead frame 54 and the insulating film 53.

In accordance with the present invention, a plurality of minute protrusions 57 are provided at both side portions of the upper surface of semiconductor chip 51. On the other hand, the insulating film 53 has at its upper and lower surfaces knurled surfaces. In similar, each inner lead 54b is provided at its upper and lower surfaces knurled surfaces.

In accordance with the present invention, the insulating film 53 serving to insulate the semiconductor chip 51 from the inner leads 54b comprises a fluoroethylene film having the specific inductive capacity of 2.0 to 2.2, as compared with the conventional cases comprising a polyimide film having the specific inductive capacity of 3.5. By virtue of using the fluoroethylene film having a lower specific inductive capacity, the insulating film 53 can reduce in thickness by about 44%, without increasing the parasitic capacitance occurring between the semiconductor chip 51 and each inner lead 54b. That is, while the conventional packages have an insulating polyimide film with a thickness of about 110–125 μm for preventing the generation of parasitic capacitance, the LOC package of the present invention has an insulating fluoroethylene film with a thickness of about 60 μm to about 70 μm which is approximately 44% smaller than that of the conventional insulating polyimide film.

Although such a fluoroethylene film provides an advantage of reducing the thickness of the insulating film 53 by virtue of its low specific inductive capacity, it has a drawback that its adhesion property is very poor. In accordance with the present invention, this problem can be solved by the provision of the knurled surfaces formed at respective upper and lower surfaces of the insulating film 53 and the inner leads 54b. These knurled surfaces improve the adhesive forces between the semiconductor chip 51 and each inner lead 54b and between each inner lead 54b and the package body 56 made of the epoxy molding compound. The contacting area among the above-mentioned parts can be increased by forming a plurality of uniformly spaced holes at each inner lead 54b and molding each perforated inner lead with epoxy resin.

Now, a method of making the LOC package having the above-mentioned construction will be described, in conjunction with FIGS. 5 to 8.

Figure 1:
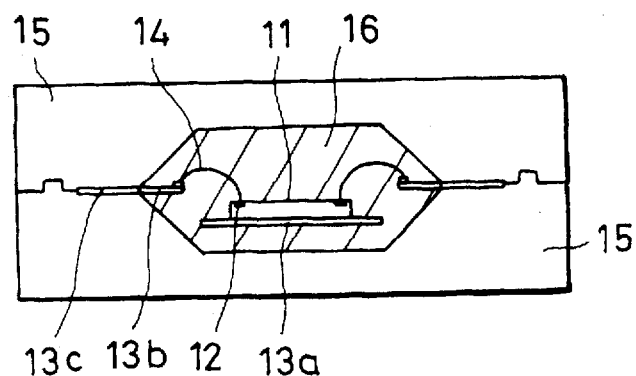
FIG. 1 is a sectional view of a package construction of a general memory IC.
Figure 2:
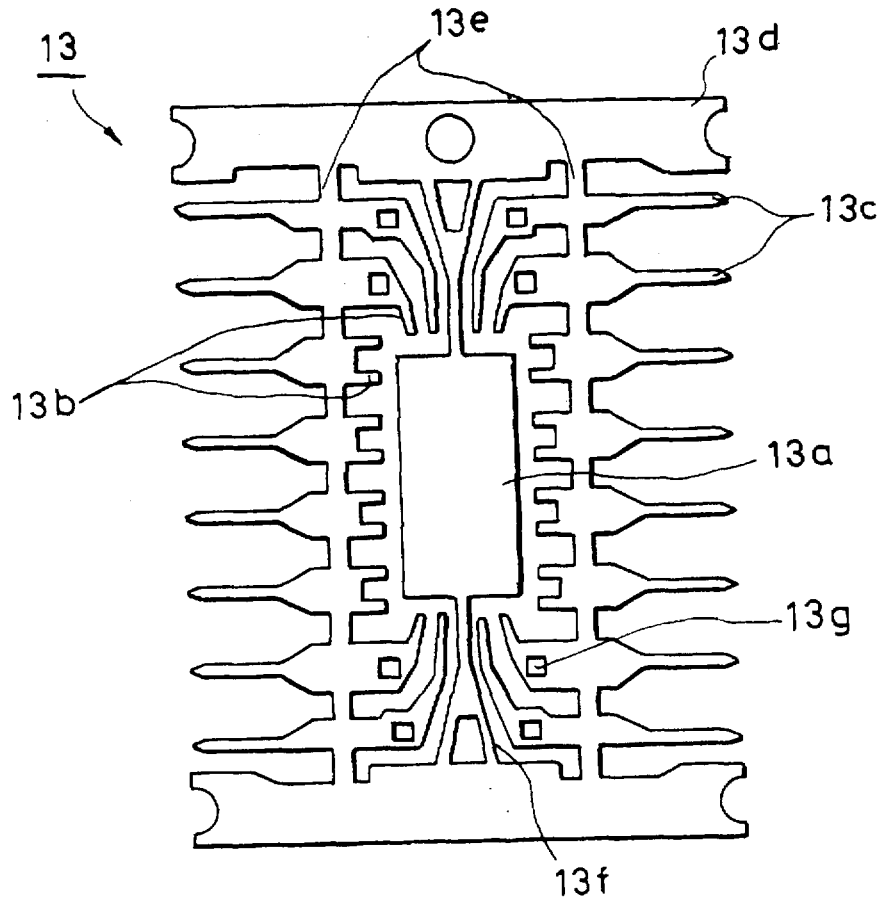
FIG. 2 is a plan view of a lead frame for the memory IC package shown in FIG. 1.
Figure 3:
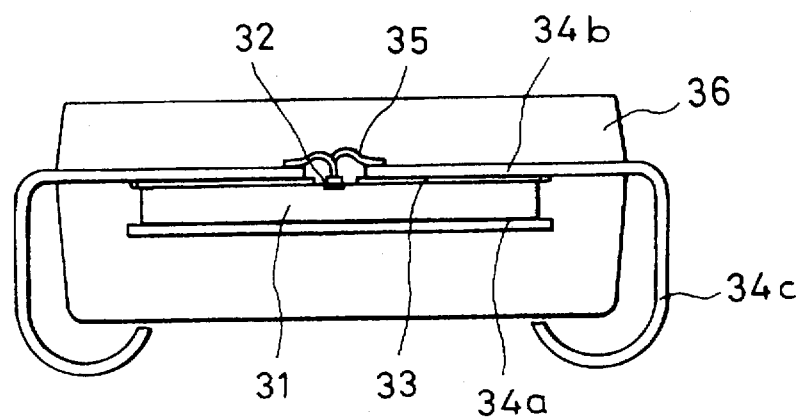
FIG. 3 is a sectional view of a conventional LOC package.
Figure 4:
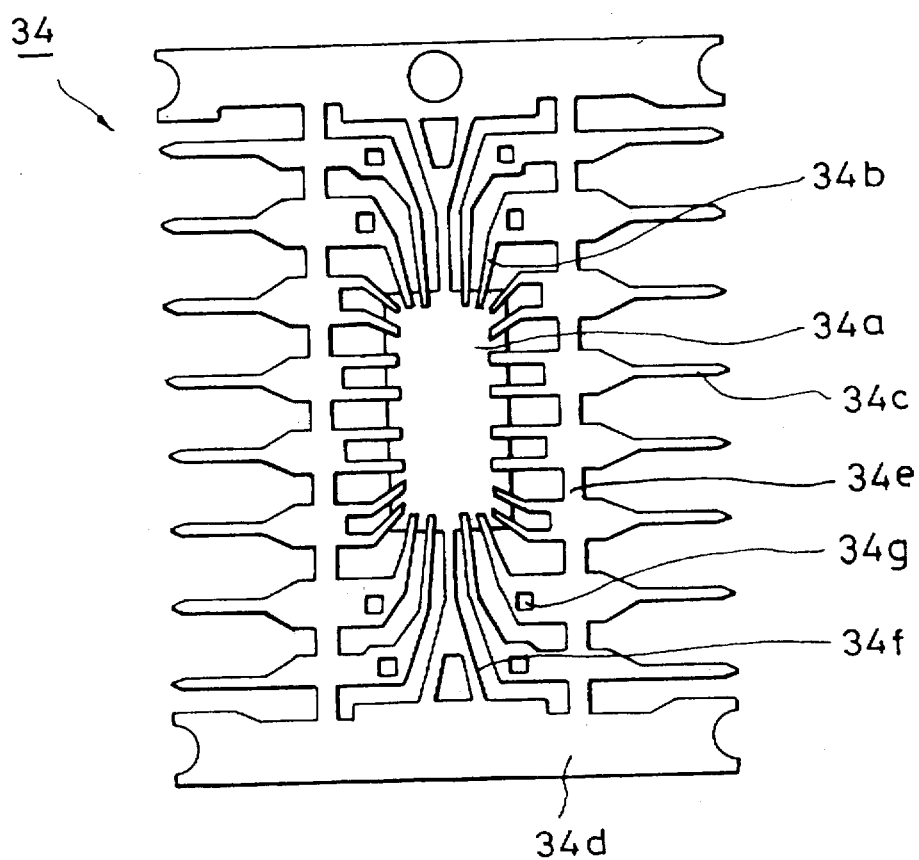
FIG. 4 is a plan view of a lead frame for the conventional LOC package shown in FIG. 3.

In accordance with the method, a lead frame 54 having the construction shown in FIG. 7 is first prepared. As shown in FIG. 7, the lead frame 54 has a plurality of inner leads 54b each extending lengthily such that its one end is positioned over the upper surface of semiconductor chip 51, in similar to the lead frame for the conventional LOC package of FIG. 4. However, each inner lead 54b of the lead frame 54 for LOC package has a construction that its portion to be connected to each corresponding bonding pad 52 of the semiconductor chip 51 has a width smaller than its portion to be connected to each corresponding outer lead 54c.

The reference numeral 54d denotes dam bars, 54e side rails, 54f support bars, and 54g locking holes.

After the preparation of the lead frame 54, a die bonding is carried out for attaching the semiconductor chip 51 to the paddle 54a of lead frame 54.

Thereafter, a plurality of minute protusions 57 are formed at the upper surface of semiconductor chip 51 carrying a plurality of bonding pads 52 arranged in a line. The formation of minute protrusions 57 is achieved by depositing a layer of $Si_3N_4$ or $SiO_2$ over both side portions of the upper surface of semiconductor chip 51 except for the portions at which the bonding pads 52 are formed, using a radio frequency (RF)-sputtering process at a low temperature, to have a thickness of about 400 Å to about 500 Å.

Over both side portions of the upper surface of semiconductor chip 51 carrying minute protrusions 57 is coated an insulating film 53 which comprises a fluoroethylene film having knurled surfaces. At upper and lower surfaces of each inner lead 54b are then formed knurled surfaces, one of which is in contact with the corresponding knurled surface of the insulating film 53.

The formation of the knurled surfaces at the inner leads 54b of lead frame 54 can be accomplished by passing the inner leads 54b between rollers each having a knurled outer surface or by coating a nodule or dendrite layer over the surfaces of inner leads 54b by an electro-plating using a high current density of not less than 100 mA/cm$^2$.

Following the formation of knurled surfaces at the inner leads 54b, a solder 55 is coated over each bonding pad 52 of semiconductor chip 51. Thereafter, a soldering process is carried out for soldering each inner lead 54b of lead frame 54 to each corresponding bonding pad 52 by means of each corresponding solder 55, thereby achieving an electrical connection between the semiconductor chip 51 and each inner lead 54b.

Figure 8:
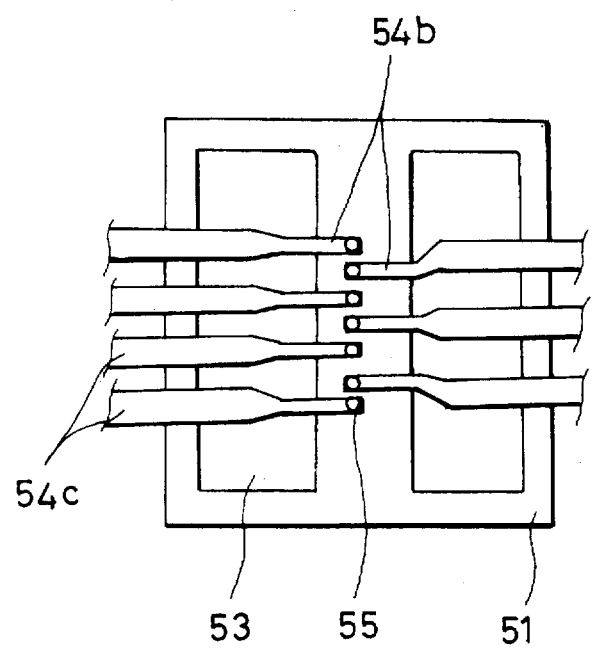
FIG. 8 is a plan view illustrating a soldering process in a method of making a LOC package in accordance with the present invention.

As shown in FIG. 8, each inner lead 54b of the lead frame 54 has a construction that its portion connected to each corresponding bonding pad 52 of the semiconductor chip 51 has a width smaller than its portion connected to each corresponding outer lead 54c. With this construction, the inner leads 54b are alternately arranged on the solders 55 after soldering and thus electrically connected to the semiconductor chip 51. With this arrangement, the overall thickness of the package can be efficiently reduced.

Figure 6A:
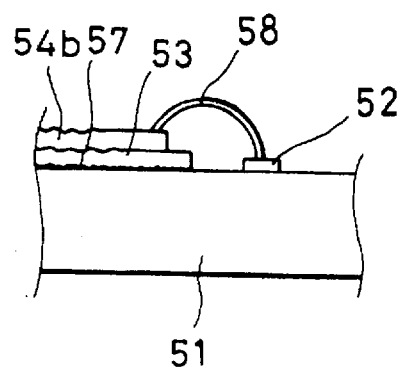

The electrical connection between the semiconductor chip 51 and the inner leads 54b can be achieved by using a wire bonding method using general wires 58 as shown in FIG. 6A. For reducing the overall thickness of package, however, the inner leads 54b may be directly connected to the bonding pads 52 by using a tape auto bonding method or a C-4 bonding method, as shown in FIGS. 5B and 6C.

Thereafter, a predetermined part of the package including the semiconductor chip 51 and the inner leads 54b is molded with an epoxy molding compound, to form a package body 56. The resultant package is then subjected to trimming and forming processes. Thus, a single in line type LOC package is obtained.

Figure 9:
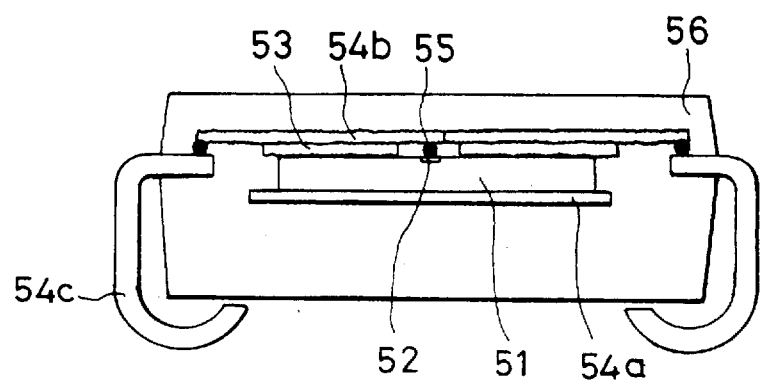
FIG. 9 is a sectional view of a LOC package according to a second embodiment of the present invention.

Referring to FIG. 9, there is illustrated a construction of LOC package in accordance with a second embodiment of the present invention.

The LOC package shown in FIG. 9 has the same construction with that of the LOC package of FIG. 5, except for the provision of a lead frame having inner leads 54b and outer leads 54c formed separately from the corresponding inner leads 54b. In this case, the inner leads 54b are coupled to the corresponding outer leads 54c using a soldering.

As apparent from the above description, the present invention uses a fluoroethylene film having a low specific inductive capacity as a polymer film for insulating a semiconductor chip from inner leads of a lead frame, as compared with conventional cases using a polyimide film having a high specific inductive capacity. Accordingly, it can be possible to reduce the thickness of the polymer film. In accordance with the present invention, knurled surfaces are formed at upper and lower bonding surfaces of the polymer film and inner leads of a lead frame while a plurality of minute protrusions are formed at the upper bonding surface of a semiconductor chip. By virtue of these knurled surfaces and minute protrusions, the problem encountered upon bonding the inner leads with the polymer film due to the use of the fluoroethylene film can be solved. It is also possible to reduce the thickness of polymer film and prevent an increase in parasitic capacitance. As a result, there is provided an effect of assisting packages to be laminate, by virtue of the reduced thickness of polymer film.

Although the preferred embodiments of the present invention have been disclosed for illustrative purpose, those skilled in the art will appreciate that various modifications, additions and substitutions are possible, without departing from the scope and spirit of the invention as disclosed in the accompanying claims.

What is claimed is:

1. A lead on chip package comprising:
    a semiconductor chip having a plurality of bonding pads arranged in a line at the center portion of the upper surface of the semiconductor chip and a plurality of minute protrusions formed at both side portions of the upper surface;
    a fluoroethylene film having a thickness of 60 micrometers to 70 micrometers formed over both side portions of the upper surface of the semiconductor chip and provided at its upper and lower surfaces with knurled surfaces;
    a plurality of inner leads each directly connected to each corresponding bonding pad of the semiconductor chip so as to be electrically connected to the semiconductor chip, each of the inner leads having knurled surfaces at its upper and lower surfaces wherein the lower knurled surface of each inner lead is in contact with the upper knurled surface of the fluoroethylene film;
    a package body surrounding the semiconductor chip, the insulating film and the inner leads; and
    a plurality of outer leads each extending from each corresponding inner lead and connected to an external element outwardly of the package body.

2. A lead on chip package as set forth in claim 1, wherein each of the outer leads is separated from each corresponding inner lead.

3. A lead on chip package as set forth in claim 1, wherein each of the outer leads is connected to each corresponding inner lead by means of soldering.

* * * * *